United States Patent
Wristers et al.

(10) Patent No.: US 6,225,188 B1
(45) Date of Patent: *May 1, 2001

(54) SELF ALIGNED METHOD FOR DIFFERENTIAL OXIDATION RATE AT SHALLOW TRENCH ISOLATION EDGE

(75) Inventors: Derick J. Wristers; H. Jim Fulford, both of Austin; Mark I. Gardner, Cedar Creek, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/524,447

(22) Filed: Mar. 14, 2000

Related U.S. Application Data

(62) Division of application No. 08/928,607, filed on Feb. 23, 1998, now Pat. No. 6,040,607.

(51) Int. Cl.$^7$ .................................................. H01L 21/265
(52) U.S. Cl. ................................................ 438/434; 438/525
(58) Field of Search .................................. 438/424, 525, 438/433, 434

(56) References Cited

U.S. PATENT DOCUMENTS

| | | |
|---|---|---|
| 5,146,291 | 9/1992 | Watabe et al. . |
| 5,391,907 | 2/1995 | Jang . |
| 5,494,846 | 2/1996 | Yamazaki . |
| 5,869,858 | 2/1999 | Ozawa et al. . |
| 5,891,787 * | 4/1999 | Gardner et al. ..................... 438/424 |
| 5,915,195 * | 6/1999 | Fulford, Jr. et al. ................ 438/525 |
| 5,930,620 * | 7/1999 | Wristers et al. .................... 438/424 |

OTHER PUBLICATIONS

Wolf et al., *Silicon Processing for the VLSI Era, vol. 1: Process Technology*, Lattice press, 1986, p. 183.

* cited by examiner

*Primary Examiner*—Olik Chaudhuri
*Assistant Examiner*—Anh Duy Mai
(74) *Attorney, Agent, or Firm*—Kevin L. Daffer; Conley, Rose & Tayon

(57) ABSTRACT

A semiconductor process in which at least one isolation structure is formed in a semiconductor substrate is provided. An oxygen bearing species is introduced into portions of the semiconductor substrate proximal to the isolation structure, preferably through the use of an ion implantation into a tilted or inclined substrate. A gate dielectric layer is then formed on an upper surface of the semiconductor substrate. The presence of the oxygen bearing species in the proximal portions of the semiconductor substrate increases the oxidation rate of the portions relative proximal to the oxidation rate of portions of the substrate that are distal to the isolation structures. In this manner, a first thickness of the gate dielectric over the proximal portions of the semiconductor substrate is greater than a second thickness of the gate oxide layer over remaining portions of the semiconductor substrate. The increased oxide thickness adjacent to the discontinuities of the isolation trench reduces the electric field across the oxide.

17 Claims, 3 Drawing Sheets

SELF ALIGNED METHOD FOR DIFFERENTIAL OXIDATION RATE AT SHALLOW TRENCH ISOLATION EDGE

This is a Division of application Ser. No. 08/928,607, filed Feb. 23, 1998. Now U.S. Pat. No. 6,040,607.

BACKGROUND OF THE INVENTION

1. Field of the Invention

The present invention relates to the field of semiconductor processing and more particularly to a method of improving transistor reliability by fabricating a gate dielectric film in which the gate dielectric thickness is increased proximal to the isolation regions to reduce the electric field in these regions.

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor channels shrink below 0.5 microns, the limitations of conventional transistor processing become more apparent. To combat short channel effects in deep sub-micron transistors, the depth of the source/drain junctions and the thickness of the gate oxides must be reduced. Devices become more susceptible, however, to breakdown due to electrical stress across the oxide. In a conventional sub-micron transistor, for example, gate dielectric thickness in the range of approximately 100 angstroms are not uncommon. If a 3.3 volt potential is applied across this film, a common occurrence in MOS transistors, the resulting electrical field has a nominal value in the range of approximately 3.3 MV/cm. In regions of the underlying gate dielectric proximate to geometric discontinuities, a localized electric field can greatly exceed the nominal value and can cause dielectric breakdown. Accordingly, it has been theorized that the gate dielectric is more likely to breakdown in regions of the device adjacent or proximal to isolation structures and, more particularly, shallow trench isolation structures, where discontinuities in the underlying substrate are common and can result in electrical fields exceeding 6 MV/cm, which is considered to be an upper limit on the electrical field sustainable by a thermally formed $SiO_2$ film. See, e.g., 1 S. Wolf & R. Tauber, *Silicon Processing for the VLSI Era* 183 (Lattice Press 1986) [hereinafter "Wolf Vol. 1"].

Despite the problem of dielectric breakdown, thin gate dielectrics are desirable in the active regions of a device because the transistor drive current is inversely proportional to the gate oxide thickness over a wide range of operating conditions. Because higher drive currents result in faster devices, a great deal of effort has been directed towards reducing the gate oxide thickness (as well as other transistor geometries including channel length and junction depth) without significantly reducing the reliability of the integrated circuit.

Therefore, it would be highly desirable to fabricate a gate dielectric that simultaneously possessed the requisite thinness in critical active regions of the device and an improved resistance to dielectric breakdown in regions of the device proximal to discontinuities in the dielectric.

SUMMARY OF THE INVENTION

The problems identified above are in large part addressed by a semiconductor fabrication process in which an oxygen bearing species is introduced into regions of the semiconductor substrate proximal to an isolation structure within the substrate. The introduction of an oxygen bearing species into the semiconductor substrate facilitates the fabrication of a gate dielectric film having two thicknesses. A first thickness over the active regions of the semiconductor substrate is relatively thin compared to a second thickness of the gate dielectric film over the portions of the semiconductor substrate proximal to the isolation structures. The increased thickness adjacent to the isolation structures beneficially reduces the electric field experienced by the gate dielectric in this region resulting in less frequent dielectric break down at the isolation edges.

Broadly speaking, the present invention contemplates a semiconductor fabrication process in which a patterned isolation masking layer is formed on an upper surface of a semiconductor substrate. The isolation masking layer exposes at least one isolation region of the semiconductor substrate. An isolation structure is then formed in the isolation region. Preferably, the upper surface of the isolation structure is substantially co-planar or below the upper surface of the semiconductor substrate. An oxygen bearing species is then introduced into the upper portion of the semiconductor substrate proximal to the isolation dielectric with the isolation masking layer still in place. After removing the isolation masking layer, a gate dielectric is formed by thermally oxidizing the upper surface of the semiconductor substrate. An oxidation rate of the substrate proximal to the isolation structure is greater than an oxidation rate of the substrate distal from the isolation region. In this manner, a thickness of the gate oxide proximal to the isolation structure is greater than a thickness of the gate oxide distal from the isolation structure.

Preferably, the formation of the patterned isolation masking layer is accomplished by depositing a dielectric layer on an upper surface of the semiconductor substrate, forming a patterned photoresist layer on an upper surface of the dielectric layer, and removing portions of the dielectric layer exposed by the patterned photoresist layer. In one embodiment, the deposition of the dielectric layer includes thermally decomposing silane and ammonium in a chemical vapor deposition reactor chamber maintained at a temperature in the range of approximately 200° C. to 800° C. The formation of the isolation structure is preferably accomplished by plasma etching an isolation trench into the isolation region of the semiconductor substrate, filling the isolation trench with an isolation dielectric material, and removing portions of the isolation dielectric material from regions exterior to the isolation trench. The filling of the isolation trench is typically accomplished by depositing oxide into the trench. The deposition of the trench oxide may be preferably accomplished by thermally decomposing TEOS in a plasma enhanced chemical vapor deposition reactor chamber maintained at a temperature in the range of approximately 250° C. to 750° C. The removal of portions of the isolation dielectric may be accomplished by polishing the dielectric with a chemical mechanical polish until an upper surface of the isolation dielectric is approximately planar with an upper surface of the patterned isolation masking layer and, thereafter, etching back the isolation dielectric until an upper surface of the isolation dielectric is recessed below or approximately planar with an upper surface of the semiconductor substrate.

In one embodiment, the present invention further includes the step of immersing the semiconductor substrate in an oxygen bearing ambient maintained at a temperature in the range of approximately 500° C. to 800° C. prior to the filling of the isolation trench to grow a liner oxide on a floor and sidewalls of the isolation trench. In one embodiment, the introduction of the oxygen bearing species includes at least one ion implantation process. In a presently preferred embodiment, the semiconductor substrate is tilted at an angle greater than approximately 10° for each of the implant steps in which oxygen is introduced into the substrate. The preferred ion implantation process includes an implant dose in the range of approximately $10^{14}$ to $10^{15}$ atoms/cm$^2$ and is preferably accomplished using an implant energy in the range of approximately 10 to 50 keV. In one embodiment, a conductive layer is deposited on an upper surface of the gate dielectric layer. In this embodiment, the deposition of the conductive gate layer is preferably accomplished by decomposing silane in a chemical vapor deposition reactor chamber maintained at a temperature in the range of approximately 580° C. to 650° C.

The present invention still further contemplates an integrated circuit including a semiconductor substrate, at least one isolation structure, and a gate dielectric formed on an upper surface of the semiconductor substrate. The semiconductor substrate includes at least one isolation region. The isolation structure comprises an isolation dielectric contained within an isolation trench that is formed in the isolation region of the semiconductor substrate. The substrate includes an oxygen bearing impurity distribution in regions of the semiconductor substrate proximal to the isolation structure. A first thickness of the gate oxide over regions of the semiconductor substrate proximal to the isolation regions is greater than a second thickness of the gate dielectric over portions of the semiconductor substrate distal from the isolation region.

In one embodiment, the semiconductor substrate includes a p-type epitaxial layer formed on a p+ silicon bulk. A resistivity of the p-type epitaxial layer is preferably in the range of approximately 10 to 15 Ω-cm. The isolation dielectric preferably includes a chemical vapor deposited oxide. The proximal portions of the semiconductor substrate are typically within approximately 200 angstroms of the isolation structure. The preferred gate dielectric includes a thermal oxide. In this embodiment, the first thickness is preferably in the range of approximately 30 to 100 angstroms and the second thickness is in the range of approximately 15 to 50 angstroms.

The present invention still further contemplates a method for reducing an electric field in peripheral portions of a gate dielectric. The method includes oxidizing an upper surface of a semiconductor substrate to form a gate dielectric on the substrate. The substrate includes an oxygen bearing impurity distribution within regions of the substrate proximal to an isolation region of the substrate. The presence of the oxygen bearing impurity distribution increases the oxidation rate of the semiconductor substrate over these proximal regions. This results in a gate dielectric that includes a first thickness over the proximal regions and a second thickness over regions of the semiconductor substrate distal from the isolation structure. Preferably, the oxygen bearing impurity distribution is introduced into the semiconductor substrate with an ion implantation performed prior to the removal of a patterned mask that covers proximal portions of the semiconductor substrate. The substrate is tilted at an angle greater than approximately 10° during the implanting. This permits implanted ions to enter the proximal regions of the semiconductor substrate.

BRIEF DESCRIPTION OF THE DRAWINGS

Other objects and advantages of the invention will become apparent upon reading the following detailed description and upon reference to the accompanying drawings in which.

Figure 1:
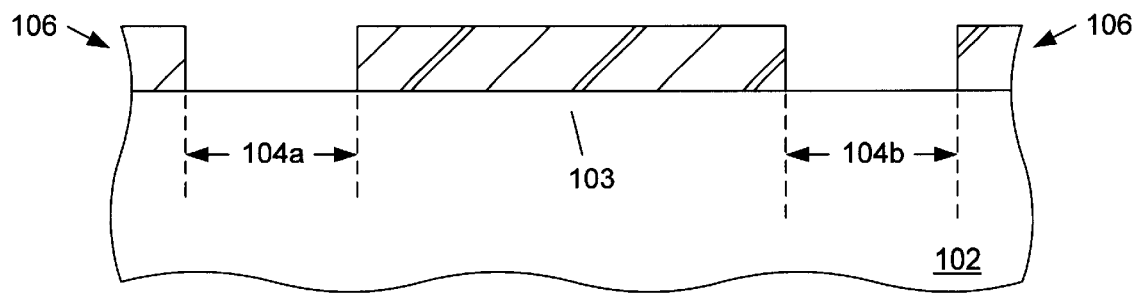
FIG. 1 is a partial cross-sectional view of a semiconductor substrate over which a patterned isolation masking layer has been formed to expose isolation regions of the semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIG. 1 shows a semiconductor substrate 102 including an isolation structure 104a and a second isolation structure 104b laterally displaced from first isolation structure 104a. In the preferred embodiment, semiconductor substrate 102 comprises a single crystal silicon wafer as are well known in the art of semiconductor processing. In one embodiment useful in the fabrication of CMOS integrated circuits, semiconductor substrate 102 may include a p-type epitaxial layer formed over a p+ silicon bulk. In this embodiment, a preferred resistivity of p-type epitaxial layer is in the range of approximately 10 to 15 Ω-cm. (For purposes of this disclosure, "a p+ or n+ designation" refers to an impurity concentration in excess of approximately $10^{19}$ atoms/cm$^3$). Isolation regions 104 designate areas of semiconductor substrate 102 that will ultimately contain isolation structures. Accordingly, the region 103 between the pair of isolation structures 104a and 104b designates an active area of the semiconductor substrate, or in other words, an area of the semiconductor substrate into which transistors other device circuit elements will be formed. FIG. 1 further includes a patterned isolation masking layer 106 formed on an upper surface of semiconductor substrate 102. Patterned masking layer 106 is patterned to expose isolation regions 104a and 104b. In one embodiment, patterned isolation masking layer 106 may comprise a patterned photoresist layer produced using conventional photolithography and photoresist processing techniques. In another embodiment, patterned isolation masking layer 106 comprises a dielectric such as oxide or silicon nitride. In an embodiment of the invention in which the patterned isolation masking layer 106 comprises a dielectric, the formation of the masking layer 106 may be suitably accomplished by depositing a dielectric layer on an upper surface of semiconductor substrate 102, forming a photoresist layer (not shown in the figures) on an upper surface of the dielectric layer, and removing portions of the dielectric layer exposed by the patterned photoresist layer. In one such embodiment, the deposition of the dielectric layer is suitably accomplished by thermally decomposing silane and ammonium in a chemical vapor deposition maintained at a temperature in the range of approximately 200° C. to 800° C. As will be appreciated to those skilled in the art of semiconductor processing, thermal decomposition of silane and ammonium typically results in the deposition of a silicon nitride layer. Silicon nitride is useful in the present invention because of its etch selectively with respect to both silicon and oxide as will become apparent upon reading the following detailed description. Those skilled in the art will appreciate that it is typically considered undesirable to deposit silicon nitride directly upon a silicon substrate because of the high tensile stress that silicon nitride imparts to a silicon substrate. To alleviate this stress, the patterned isolation masking layer 106 shown in FIG. 2 may include a deposited oxide in contact with an upper surface of semiconductor substrate 102.

Figure 2:
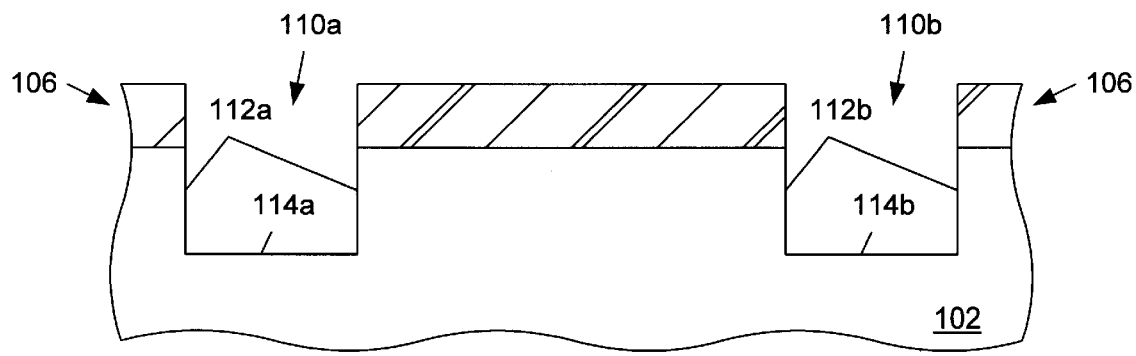
FIG. 2 is a processing step subsequent to FIG. 1 in which isolation trenches have been etched into the isolation regions of the semiconductor substrate.

Turning now to FIG. 2, isolation trenches 110a and 110b are etched into semiconductor substrate 102. The formation of isolation trenches 110a and 110b, in a presently preferred embodiment, is accomplished using a chlorine bearing plasma etch process useful in the anisotropic etching of silicon. A suitable etch process used to fabricate isolation trenches 110 results in the formation of substantially vertical sidewalls 112 and a trench floor 114. A suitable range for a depth of isolation trenches 110 is typically in the range of approximately 1000 to 3000 angstroms. As will be appreciated to those skilled in the art, the presence of patterned isolation masking layer 106 during the process used to fabricate isolation trenches 110 substantially prevents removal of semiconductor substrate 102 from regions exterior to isolation regions 104 of semiconductor substrate 102.

Figure 3:
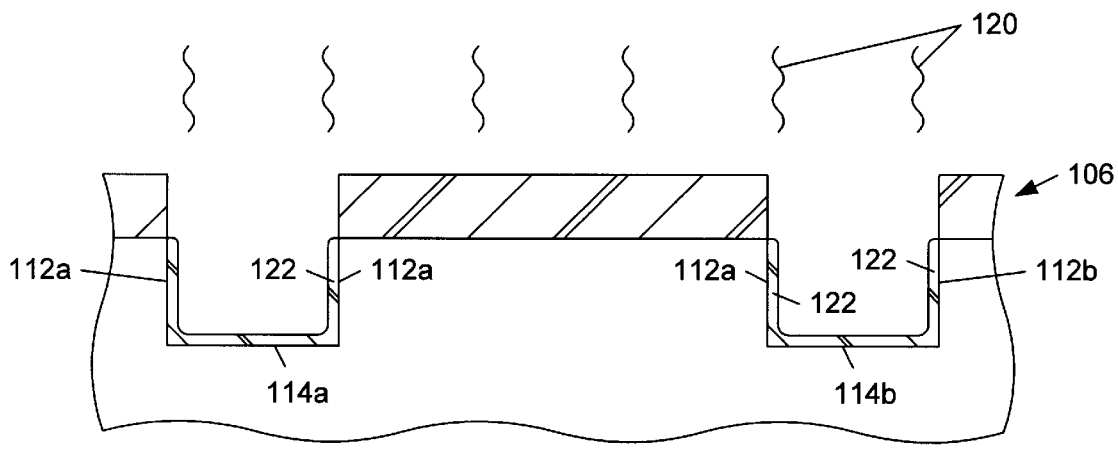
FIG. 3 is a processing step subsequent to FIG. 2 in which a thermal oxide liner has been formed on sidewalls and the floor of the isolation trenches.

Turning now to FIG. 3, an optional processing step is shown in which a thermal oxidation process 120 is used to produce a thermal oxide liner 122 on sidewalls 112 and trench floor 114 of isolation trenches 110. In this embodiment, thermal oxide trench liner 122 is grown by immersing semiconductor substrate 102 into an oxygen bearing ambient maintained at a temperature in the range of approximately 500° C. to 800° C. As will be appreciated to those skilled in the art, thermal oxidation processes are typically performed at a temperature in excess of the maximum suitable temperature for a photoresist material. Accordingly, in an embodiment of the present invention, including a thermal oxide trench liner 122, a dielectric material capable of withstanding temperatures necessary to form a thermal oxide are typically used. In addition to their greater tolerance to high temperature processing, an appropriate dielectric material such as silicon nitride prevents substantial thermal oxidation of the underlying silicon substrate 102 in regions exterior to isolation regions 104. Thus, in an embodiment of the present invention in which the isolation masking layer 106 comprises silicon nitride, the thermal oxidation process 120 identified in FIG. 3 will result in selective oxidation of semiconductor substrate 102 within isolation regions 104. The presence of a thermal oxide liner is considered desirable in many shallow trench isolation integrated circuits because of the thermal oxides tendency to produce a higher quality interface between the isolation trench region 104 and the active region 103 of semiconductor substrate 102. More specifically, it is theorized that the plasma etch process used to form the isolation trench typically produces a high quantity of dangling silicon bonds at the trench surface. These dangling interface bonds may result in undesirable leakage of mobile carriers near the isolation structures. It is to be understood, however, that the present invention may be suitably fabricated without the thermal process 120 identified in FIG. 3.

Figure 4:
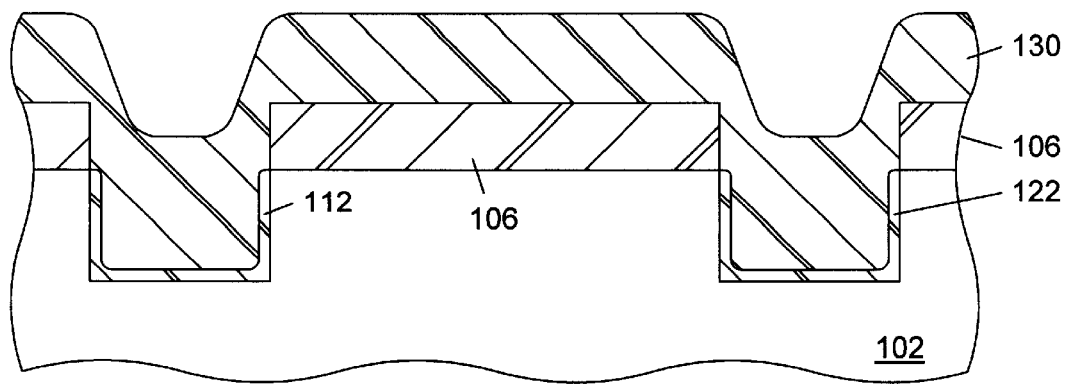
FIG. 4 is a partial cross-sectional view in which an isolation dielectric material has been deposited to fill the isolation trenches.

Turning now to FIG. 4, an isolation dielectric material 130 is deposited into isolation trenches 110a and 110b to fill the trenches. The deposition of a suitable oxide into isolation trenches 110 is accomplished in a preferred embodiment by thermally decomposing TEOS in a chemical vapor deposition reactor chamber maintained at a temperature in the range of approximately 250° C. to 700° C. As represented in FIG. 4, a suitable oxide deposition produces isolation dielectric material both interior and exterior to the isolation trenches 110.

Figure 5:
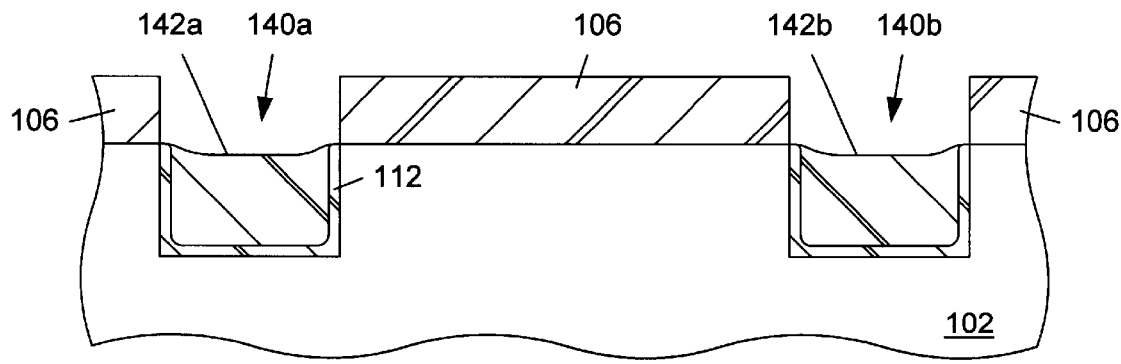
FIG. 5 is a processing step subsequent to FIG. 4 in which the isolation dielectric material has been planarized to produce an isolation structure within the isolation trench wherein the isolation structure includes an upper surface that is substantially planar or below an upper surface of semiconductor substrate 102.

Turning now to FIG. 5, the portions of isolation dielectric material 130 exterior to isolation trenches 110 are removed with a suitable planarization process. In one embodiment, a suitable planarization process may include a chemical mechanical polish suitably used to reduce an upper surface of isolation dielectric material 130 that is substantially co-planar or perhaps even slightly below an upper surface of patterned isolation masking layer 106. Subsequent to a chemical mechanical polish process, the upper surface of isolation dielectric material 130 may be further reduced with an etch back process selective to the dielectric material 130. Using a suitable etchback results in the selective removal of isolation dielectric material 130 and reduces an upper surface of isolation dielectric material 130 until the upper surface is substantially planar or even slightly below an upper surface of semiconductor substrate 102. Thus, the planarization process results in the formation of isolation structures 140a and 140b. Isolation structures 140 include the portion of isolation dielectric material 130 left behind after the etch. Isolation structures 140 include an upper surface 142 substantially planar or even below an upper surface of semiconductor substrate 102. It will be appreciated to those skilled in the art that the silicon etch represented by FIG. 2, the selective thermal oxidation represented in FIG. 3, and the planarization process of FIG. 5 are achievable using only one patterned masking layer 106 if the patterned masking layer 106 comprises silicon nitride. Accordingly, a preferred embodiment of the present invention contemplates that patterned isolation masking layer 106 comprises a layer of silicon nitride.

Figure 6:
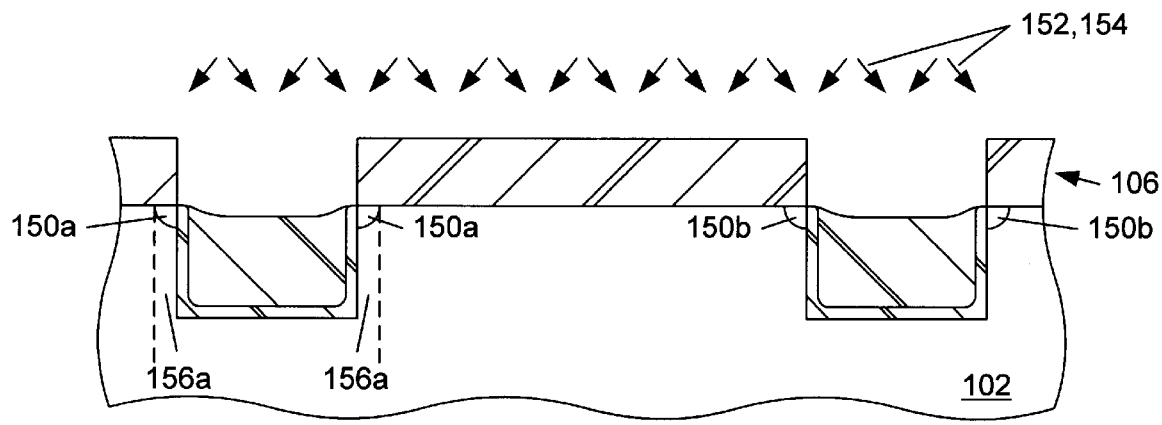
FIG. 6 is a processing step subsequent to FIG. 5 in which one or more ion implantation processes is performed with the patterned isolation masking layer still in place.

Turning now to FIG. 6, oxygen bearing impurity distributions 150 are introduced to upper regions of semiconductor substrate 102 proximal to isolation trenches 140. As shown in FIG. 6, the introduction of the oxygen bearing impurity distribution is accomplished while patterned isolation masking layer 106 is still present upon the upper surface of semiconductor substrate 102. The isolation masking layer is left in place to substantially prevent the presence of oxygen in portions of the active region 103 exterior to the proximal portions 156 of semiconductor substrate 102. In the preferred embodiment, proximal portions 156 of semiconductor substrate 102 include the portions of semiconductor substrate 102 proximal to sidewalls 112 of isolation trench 110. In one preferred embodiment, the proximal portions of semiconductor substrate 102 comprise those portions 156 of semiconductor substrate 102 within approximately 200 angstroms of isolation structures 140. In the preferred embodiment, the introduction of the oxygen bearing impurity distribution into semiconductor substrate 102 is preferably accomplished using multiple ion implantations represented in FIG. 6 by reference numerals 152 and 154. In the preferred embodiment ion implantations 152 and 154 are carried out with semiconductor substrate 102 inclined at an angle of approximately 10° or more. The inclination of the semiconductor substrate during the oxygen ion implantation process facilitates the introduction of the impurity distribution into the semiconductor substrate while a masking layer such as isolation masking layer 106 is resident upon the wafer upper surface. In one embodiment, the ion implantation is represented by reference numerals 152 and 154 represent a processing in which two distinct implantations are performed wherein the semiconductor substrate 102 is rotated 180° between the two ion implantations. In another embodiment (not explicitly shown in the figures) the oxygen bearing ion implantation may comprise, for example, four ion implantations wherein the semiconductor substrate 102 is rotated 90° between each successive ion implantation. The multiple implantation combined with the rotation of semiconductor substrate 102 ensures that the implanted species is introduced into the proximal portions 150 of semiconductor substrate 102 on all sides of the isolation trench 110. Alternative embodiments are readily imaginable in which more than four ion implantation processes are performed using more than four rotations of the semiconductor substrate. In general, the present invention contemplates that any number n of ion implantations may be performed wherein the semiconductor substrate is rotated through an angle of approximately 360°/n. It will be apparent to those skilled in the art of semiconductor processing, however, that diminishing returns are produced by each successive ion implantation process and, therefore a number of ion implantation steps can be realistically assumed to be less than approximately 8. Suitable implantation process for the present invention are carried out using an implant dose of approximately $10^{14}$ to $10^{17}$ atoms/cm$^2$ and an implant energy of approximately 10 to 50 keV. The use of a tilted substrate during the ion implantation process represented by reference numeral 152 and 154 results in the potential savings of a masking step by eliminating the need to fabricate a masking structure that exposes the proximal portions 156 of semiconductor substrate 102.

Figure 7:
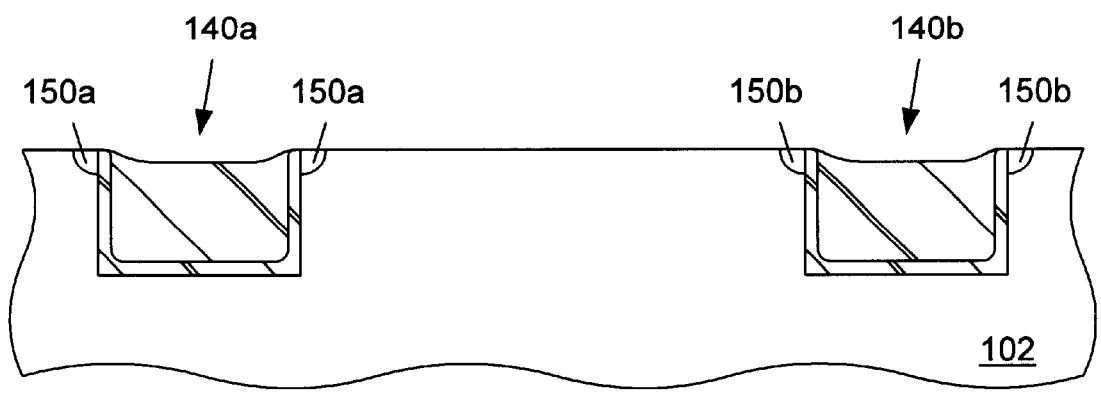
FIG. 7 is a processing step subsequent to FIG. 6 in which the patterned isolation masking layer has been removed.

Turning now to FIG. 7, isolation masking layer 106 has been removed from semiconductor substrate 102. In embodiments of the present invention in which masking layer 106 comprises silicon nitride, a suitable removal process includes dipping semiconductor substrate 102 in a phosphoric solution maintained at a temperature of approximately 95° C. Further cleaning steps are suitably desirable prior to the fabrication of a thermal oxide upon the upper surface of semiconductor substrate 102. Exemplary cleaning processes may include, for example, an RCA clean to eliminate organic and metallic contaminants from semiconductor substrate 102 prior to the formation of a gate dielectric.

Figure 8:
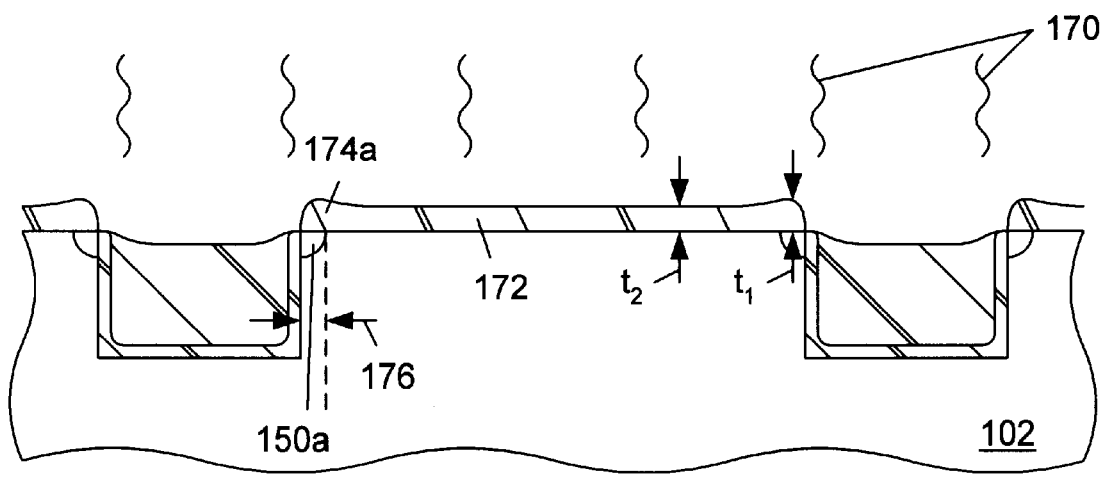
FIG. 8 is a processing step subsequent to FIG. 7 in which a thermal oxidation process is performed resulting in the formation of a gate dielectric film which includes a thicker region of the film over portions of the semiconductor substrate proximal to the isolation structures.
Figure 9:
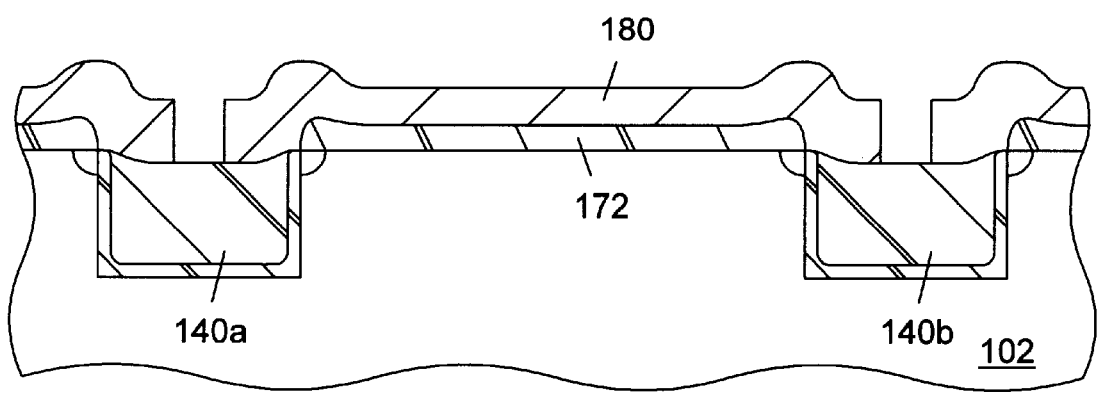
FIG. 9 is a processing step subsequent to FIG. 8 in which a conductive gate layer is deposited on an upper surface of the gate dielectric layer.

Turning now to FIG. 8, gate dielectric layer 172 is fabricated using a thermal oxidation process 170. The oxygen bearing impurity distributions proximal to the isolation structures results in a higher oxidation rate of silicon substrate 102 in regions of the substrate proximal to the isolation structures 140. Thermal oxidation process 170 suitably comprises immersing semiconductor substrate in an oxygen bearing ambient maintained at a temperature in the range of approximately 500° C. to 800° C. In a preferred embodiment, the oxidation process results in a first thickness $t_1$ of gate dielectric 172 over proximal portions 156 of semiconductor substrate 102 and a second thickness $t_2$ over remaining portions of semiconductor substrate 102. In one presently preferred embodiment, a suitable range for first thickness $t_1$ is in the range of approximately 30 to 100 angstroms while a suitable thickness of second thickness $t_2$ is in the range of approximately 15 to 50 angstroms. Turning now to FIG. 9, an optional processing step is shown in which a conductive gate structure 180 has been formed on an upper surface of gate dielectric layer 172. A suitable process for forming conductive gate layer 180 may include, for example, thermally decomposing silane in a chemical vapor deposition reactor chamber maintained at a temperature of approximately 580° C. to 650° C. resulting in a deposition of polysilicon as will be appreciated to those skilled in the art. In other embodiments, conductive gate structure 180 may include aluminum, copper, or a conductive silicide. Conductive gate structure 180 as shown in FIG. 9 has been patterned using a suitable photolithography and etch process. It will be appreciated that conductive gate structure 180 may represent the conductive gate of an MOS transistor. In such an embodiment, it will be appreciated that conductive gate structure 180 may be suitably biased to a voltage of, for example, 3.3. volts during normal circuit operation. Under these conditions, an electric field may develop across gate dielectric layer 172. While the value of the resulting electric field may be estimated quite simply in the active regions of the semiconductor substrate by dividing the applied bias by the thickness of the gate dielectric layer 172, it will be appreciated that the geometric discontinuities of semiconductor substrate 102 proximal to isolation structures 140 may result in increased and localized electric fields proximal to isolation structure 140. This increased electric field may exceed the desirable electric field that may be safely applied across gate dielectric 172 without resulting in gate dielectric breakdown. To prevent such a situation, the increased thickness $t_1$ of gate dielectric layer 172 over proximal portions of semiconductor substrate 102 reduces the electric field (measured in terms of mega volts per cm) to which the gate dielectric 172 is subjected. By reducing the electric field in the high field areas of the device, it is theorized that the present invention may result in more reliable and longer lasting dielectric layers.

Thus, it will be appreciated to those skilled in the art that the present invention represents a method for reducing electric field in peripheral portions of a gate dielectric by thermally oxidizing an upper surface of the semiconductor substrate where the substrate includes an oxygen bearing impurity distribution within the regions of the semiconductor substrate proximal to an isolation region of the substrate. The resulting increased oxidation rate of the substrate over the proximal regions results in a thickness gate dielectric over the proximal regions and a second thickness gate dielectric over regions of the substrate distal from the isolation structure.

While the present invention has been described with respect to the drawings and detailed description, obvious modifications to the preferred embodiment may be readily apparent to those skilled in the art, the present invention is intended to encompass all such obvious modifications and the accompanying claims are intended to be interpreted broadly to include all such modifications and changes.

What is claimed is:

1. A semiconductor fabrication process comprising:
   providing a semiconductor substrate;
   forming a patterned isolation masking layer on an upper surface of said semiconductor substrate, wherein said isolation masking layer exposes at least one isolation region of said semiconductor substrate;
   forming an isolation structure in said isolation region, wherein an upper surface of said isolation structure is substantially coplanar with or below said upper surface of said semiconductor substrate;
   with said isolation masking layer in place, introducing an oxygen bearing species into an upper portion of said semiconductor substrate proximal to said isolation dielectric; and
   after removing said isolation masking layer, forming a gate dielectric by thermally oxidizing said upper surface of said semiconductor substrate, wherein an oxidation rate of said semiconductor substrate proximal to said isolation structure is greater than an oxidation rate of said semiconductor substrate distal from said isolation region, whereby a thickness of said gate dielectric proximal to said isolation structure is greater than a thickness of said gate dielectric distal from said isolation structure after said forming a gate dielectric.

2. The process of claim 1, wherein said forming said patterned isolation masking layer comprises:
   depositing a dielectric layer on an upper surface of said semiconductor substrate; and
   forming a patterned photoresist layer on an upper surface of said dielectric layer; and
   removing portions of said dielectric layer exposed by said patterned photoresist layer.

3. The process of claim 2, wherein said depositing said dielectric layer comprises thermally decomposing silane ($SiH_4$) and ammonium ($NH_3$) in a chemical vapor depositing reactor chamber maintained at a temperature in the range of approximately 200 to 800° C.

4. The process of claim 2, wherein said removing said portions of said dielectric layer comprises plasma etching said dielectric layer.

5. The process of claim 1, wherein said forming said isolation structure comprises:
   plasma etching an isolation trench into said isolation region of said semiconductor substrate;
   filling said isolation trench with an isolation dielectric material; and
   removing portions of said isolation dielectric material from regions exterior to said isolation trench.

6. The process of claim 5, wherein said filling said isolation trench comprises depositing oxide.

7. The process of claim 6, wherein said depositing said oxide comprises thermally decomposing TEOS in a plasma enhanced chemical vapor deposition reactor chamber maintained at a temperature in the range of approximately 250 to 750° C.

8. The process of claim 5, wherein said removing portions of said isolation dielectric comprises:
   polishing said isolation dielectric with a chemical mechanical polish until an upper surface of said isolation dielectric is approximately planar with an upper surface of said patterned isolation masking layer; and
   etching back said isolation dielectric so that an upper surface of said isolation dielectric is recessed below an upper surface of said patterned isolation masking layer.

9. The process of claim 5, further comprising, prior to said filling said isolation trench, immersing said semiconductor substrate in an oxygen bearing ambient maintained at a temperature in the range of approximately 500 to 800° C. to grow a liner oxide on a floor and sidewalls of said isolation trench.

10. The process of claim 1, wherein said introducing said oxygen bearing species comprises implanting said oxygen bearing species.

11. The process of claim 10, wherein during said introducing said oxygen bearing species said semiconductor substrate is tilted at an angle greater than approximately 10° for each said at least one implant.

12. The process of claim 10, wherein said implanting said oxygen bearing species comprises an implant dose in the range of approximately $10^{14}$ to $10^{15}$ atoms/cm$^2$.

13. The process of claim 10, wherein said implanting said oxygen bearing species comprises an implant energy in the range of approximately 10 to 50 keV.

14. The process of claim 1, further comprising depositing a conductive gate layer on an upper surface of said gate dielectric.

15. The process of claim 14, wherein said depositing said conductive gate layer comprises thermally decomposing silane in a chemical vapor deposition reactor chamber maintained at a temperature in the range of approximately 580 to 650° C.

16. In a semiconductor manufacturing process, a method for reducing an electric field in peripheral portions of a gate dielectric, said method comprising thermally oxidizing an upper surface of a semiconductor substrate to form a gate dielectric on said semiconductor substrate, wherein said substrate includes an oxygen bearing impurity distribution within regions of said semiconductor substrate proximal to an isolation region of said substrate to increase an oxidation rate of said semiconductor substrate above said proximal regions whereby said gate dielectric includes a first thickness over said proximal regions and a second thickness less than said first thickness over regions of said semiconductor substrate distal from said isolation structure, and wherein said oxygen bearing impurity distribution is introduced into said semiconductor substrate by ion implanting an oxygen species into said semiconductor substrate in the presence of a patterned mask, said patterned mask covering said proximal portions of said semiconductor substrate, wherein said semiconductor substrate is tilted at an angle greater than approximately 10° during said implanting thereby permitting implanted ions to enter said proximal regions of said semiconductor substrate.

17. A semiconductor fabrication process, comprising:

implanting an oxygen bearing species into an upper portion of a semiconductor substrate adjacent to an isolation trench, wherein said implanting an oxygen bearing species forms an oxygen bearing impurity distribution within an upper portion of the semiconductor substrate proximal to the isolation trench, and wherein said implanting an oxygen bearing species further comprises tilting the semiconductor substrate at an angle greater than approximately 10° during said implanting; and masking at least a portion of the upper surface of the semiconductor substrate during said implanting an oxygen bearing species such that the oxygen bearing impurity distribution is contained entirely within portions of the semiconductor substrate proximal to the isolation trench and extends to the upper surface of the semiconductor substrate.

* * * * *